(12) United States Patent
Swinehart

(10) Patent No.: US 6,277,351 B1
(45) Date of Patent: Aug. 21, 2001

(54) CRUCIBLE FOR GROWING MACROCRYSTALS

(76) Inventor: Carl Francis Swinehart, 4102 Silsby, University Heights, OH (US) 44118-3318

( * ) Notice: Subject to any disclaimer, the term of this patent is extended or adjusted under 35 U.S.C. 154(b) by 0 days.

(21) Appl. No.: 09/606,820

(22) Filed: Jun. 28, 2000

Related U.S. Application Data

(63) Continuation-in-part of application No. 09/528,834, filed on Mar. 20, 2000, now Pat. No. 6,200,385.

(51) Int. Cl.[7] .................................................. C30B 29/12
(52) U.S. Cl. ...................... 423/462; 423/490; 423/491; 423/497; 117/81; 117/83; 117/940
(58) Field of Search ................................... 423/462, 490, 423/491, 497, 499.1; 252/584; 117/81–83, 940

(56) References Cited

U.S. PATENT DOCUMENTS

| | | | |
|---|---|---|---|
| 4,404,172 | * 9/1983 | Gault | 117/223 |
| 4,946,542 | 8/1990 | Clemans | 117/83 |
| 5,116,456 | 5/1992 | Nestor | 117/83 |
| 6,123,764 | * 9/2000 | Mizugaki et al. | 117/68 |

* cited by examiner

Primary Examiner—Robert Kunemund
(74) Attorney, Agent, or Firm—Alfred D. Lobo

(57) ABSTRACT

A crucible having an inner surface is not wetted by a melt which shrinks when it solidifies is provided with indentations in the walls of the crucible to support an ingot grown in it. Supporting the crystal provides a gap between the bottom of the ingot and the inner surface of the bottom of the crucible. The gap allows more uniform heat transfer from the bottom of the crucible than is provided when there is no gap; the gap provides a controllable temperature gradient between the interior and exterior of the crucible. To direct propagation of the growth of a macrocrystal, the bottom of the crucible is provided with at least one set of multiple grooves in parallel relationship with each other. Preferably a second set of multiple grooves in parallel relationship with each other intersect the grooves of the first set at an angle chosen depending upon the lattice structure of the macrocrystal to be grown. A macrocrystal grown in a crucible with twin sets of angulated grooves produces single crystals. Grooves in the floor of a conventional graphite crucible are effective to produce an ingot with minimal multiplicities, if not an essentially single crystal, even if essentially continuous contact of the bottom of the ingot with the floor is broken.

7 Claims, 8 Drawing Sheets

CRUCIBLE FOR GROWING MACROCRYSTALS

This application is a continuation-in-part application of Ser. No. 09/528,834 filed on Mar. 20, 2000, now U.S. Pat. No. 6,200,385.

BACKGROUND OF THE INVENTION

This invention relates to a crucible for growing large macrocrystals (or ingots) from a melt in a highly modified Stockbarger type furnace, or a comparable one in which slow growth of a solidifyng macrocrystal from the melt under the influence of the earth's gravity, results in the solidified macrocrystal being supported within the walls of the crucible. It is accepted practice to refer to melt-grown isometric blanks as being "single" when the finished crystal does not exhibit flaws attributable to multiple components disregarding mosaics spread which is never less than 0.250° in the flattest cleavage and can generally be seen in the texture of thermal etch. In fact a mosaic spread of 3° is valued in pulled crystals for not showing the following flaws attributable to multiple components though their displacement may be less than 1°. However the displacement may be any angle up to 90° and still be optically homogeneous when not decorated by inclusions.

Multiple components are said to be present when they are visible as a fringe pattern, or strain pattern in an optically polished crystal. Multiplicities will fracture non-cubic crystals while mosaics will not. Mosaic spread is important for X-ray plates and gun sights. Mosaics which do not have unacceptable flaws are acceptable in a single crystal.

An ideal macrocrystal is a single crystal, but typically a macrocrystal grown is only optically monocrystalline, being formed of several crystals demarcated by boundaries within the macrocrystal. Grain boundaries within a large macrocrystal (an ingot) which are discontinuities are undesirable.

More specifically the novel crucible is useful to grow crystals of halides of an element of Group 1a and Group 2a of the Periodic Table, particularly the alkali metal fluorides and alkaline earth metal fluorides, lead fluoride and crystals of the foregoing salts which are doped with desirable metal ion dopands. High quality macrocrystals of fluorides of lithium and sodium, as well as of magnesium, calcium, barium and strontium have been produced commercially since soon after 1939 when Donald Stockbarger disclosed a method for their manufacture in U.S. Pat. No. 2,149,076 and we taught methods for purifying melts in U.S. Pat. Nos. 2,498,186 and 2,550,173. However, producing high quality macrocrystals depends upon many factors, including having the skills required to duplicate successful runs. Success depends upon anticipating the need for minute adjustments in "power hours" (rate at which power is delivered to heat the melt), among others, all of which adjustments must be made before a probe inserted -in the melt shows any indication of a change in the rate of growth.

To date, a graphite crucible may be used for growing a Stockbarger macro-crystal provided the graphite is not so porous as to allow the melt to leak through it. A crucible may have an inclined or flat bottom and either might be provided with a well for a "seed crystal" holder.

U.S. Pat. No. 5,911,824 teaches that a particular graphite crucible could not contain a melt of thallium iodide doped sodium iodide, NaI(Tl) (see col 4, lines 26–34). A NaI(Tl) crystal was successfully grown in, a graphite crucible the inside surface of which is coated with graphitic pyrolitic carbon, and the crystal did not adhere to the coated surface (see col 4, lines 36–47).

However, a second crystal grown. in the same crucible, adhered strongly to the crucible and could not be removed in its entirety without a remelting procedure (see col 4, lines 60–66). If the crystal was grown in a platinum crucible, the crystal adheres to the platinum. The platinum crucible must be heated to melt the surfaces of the crystal in contact with the platinum (referred to as "remelting") before the platinum crucible may be slid off the crystal.

It is a characteristic of macrocrystals of the aforementioned fluorides of melt-grown metal or metal-like elements, that they shrink when they solidify (referred to herein as "shrinking melts"), and the first crystal grown may be readily removed because the walls of a graphite or carbon crucible are not wetted by the melt.

To be readily removed, sufficient shrinkage must occur when, and after, the melt solidifies provided also that the bond between crystal and crucible is weaker than the force needed to fracture the crystal as it cools. Since the coefficient of linear expansion of graphite is about 7.35 microinclies/(inch)(°C.) measured at about 40° C., that of the salt must be greater, preferably at least 5% greater, and more preferably 10% greater. The coefficient of fluorspar is about 19.5 micro-inches/(inch)(°C.) measured at about 40° C., so that even in a relatively small crucible having an inside diameter in the range from about 5 cm to about 25 cm, the circumferential surface of the solidified crystal pulls away from the inner walls of the crucible, and the crystal may be lifted out of the crucible with a vacuum cup without breaking the crystal or crucible., even when the crucible is cylindrical and its sides are vertical. This may be done provided the surface tension of the melt is high enough so as to fail to substantially wet the walls of the crucible; because the melt does not wet the surface of the graphite it does not to seep into its pores. Note that the linear coefficients of expansion at melt temperature will likely be substantially different from those given above.

The effect of such shrinkage on a crystal no larger than about 7.5 cm at its greatest diameter (referred to as a 7.5 cm diameter macrocrystal) is not particularly notable even if the shrinkage is not controlled, but for larger crystals that effect is; the larger the crystal, the more detrimental are the effects of such uncontrolled shrinkage.

Using a shrinking melt to grow a Stockbarger macrocrystal typically comprises slowly moving the melt at a controlled rate from a region hotter than its solidification temperature to a region cooler than its solidification temperature, controlling the relative temperatures of the regions, and maintaining a temperature gradient in a localized zone between the regions at the boundary of the melt. The temperature gradient in the zone is sufficient to allow melt to crystallize at the cooler boundary of the localized zone. An "elevator" type furnace may be used where the crucible is raised or lowered on an elevator; or a "movable temperature gradient" furnace may be used where the furnace is moved and the crucible is stationary. The gradient between melt near the top of a crystal and the sharply localized zone is in the range from about 100° C. to about 500° C. depending upon the particular halide.

It will be evident that the temperature of the edge portion of successive layers of the melt corresponds to the solidification temperature of the melt as these edge portions reach a substantially fixed location in the path of travel of the melt and solidification begins and progresses inwardly. Preferred crystals are obtained when the zone of solidification approximates a plane. It is desirable to control the rate of heat flow through the inner portion of the melt from the hotter to the cooler region. If the rate of heat flow through the inner portion of the melt is too slow, the zone of solidification tends to be concave. Properly controlling the rate of heat flow through the inner portion of the melt allows the zone of solidification to approximate a plane.

To date, the art has addressed the problem of a macrocrystal adhering to the inner surface of the crucible by either providing a very smooth microporous graphite surface, or by coating the surface of the graphite as in the '824 patent, or by lining a mechanically stable temperature resistant material such as alundum or graphite with a thin sheet of platinum as in U.S. Pat. No. 5,997,640. In either case, the better is the separation upon solidification, the more readily the macrocrystal falls to the bottom of the crucible. In a crucible in which the porosity is such that the melt seeps partially into the pores for a short distance sufficient to hold the weight of the crystal, the bottom of the solidified crystal pulls away from the bottom of the crucible, leaving a bottom gap. In many instances the seepage is insufficient to support the weight of the crystal in the walls of the crucible and the crystal will suddenly drop to the bottom of the crucible closing the gap. Such partial seepage into the pores is deemed to fail substantially to wet the interior surface of the crucible.

Making an uncontrolled change in the flow of heat and the rate of growth of the crystal within the crucible gives rise: to "sparkles". Sparkles are especially evident in ingots larger than 7.5 cm effective diameter, this being the longest diameter in a horizontal plane. With effective diameters smaller than about 7.5 cm, either the ingot does not drop or the flaws are lost with others in the "heel" of the ingot. Small ingots generally lack sparkles because minute, micron-size gas inclusions must migrate upwards to gain in size sufficient to develop reflecting facets and become visible. The "heel" refers to the base oiC an ingot which has been removed from the crucible in which the ingot was grown, and placed upside-down, so that the ingot rests on its upper surface; while the ingot was being formed the heel was at the top of the ingot. The upper portion refers to a zone above the mid-horizontal plane through the macrocrystal; the upper portion terminates in a heel demarcatable from the upper portion. The upper portion of an ingot grown in the novel crucible is essentially free from gas-induced sparkles.

In many instances the number of multiplicities is not of great concern, but in those instances where an essentially single crystal is desired, it is generally hoped that number is minimized by seeding with a single crystal. The novel crucible of this invention provides a far more reliable means for minimizing the number of multiplicities in an ingot, particularly relatively large ones which to date, are never single.

Relatively large ingots, particularly those larger than about 15 cm (6 ins.) in effective diameter, are highly susceptible to flaws due to gas inclusions, caused by small pockets of gases trapped within the ingot as it is solidifying. Such inclusions are referred to in the art as "sparkles" because these inclusions reflect flashes of light, or glitter, within the crystal when light is shone through the crystal. It is well established that sparkles are voids bounded by flat 111 facets because polarized light shows no strain that even the smallest solid would generate from different contraction rates. In $CaF_2$ grown in a Stockbarger furnace, sparkles are evidenced by flat six-sided facets. Migration of the voids (upward in a Stockbarger ingot) toward the hotter zone allows these voids to combine and spread, forming a broad generally horizontal band. In relatively small barium fluoride ($BaF_2$) ingots 15 cm (6 ins) in diameter some sparkles grow to 5 mm in -width while others remain less than 1 $\mu$m wide, all reflecting from 111 facets set by the host crystal.

In an essentially perfect crystal lattice there is no tolerable physical location in the lattice of ordered atoms for gas molecules. Any interruption which causes faster growth will trap dissolved gases on a molecular scale. While the crystal is cooling, and within about 50° C. of its melting point, trapped molecules of gases migrate toward the hotter zone. Such molecules of trapped gases are mainly carbon monoxide (CO) and hydrogen ($H_2$). Growing an ingot of an alkali metal or alkaline earth metal fluoride in a graphite crucible may provide, in addition, carbon tetrafluoride ($CF_4$) and other fluorocarbons probably by the action of $PbF_2$ (used as a getter) vapor on the very hot graphite heater along with molecules of nitrogen ($N_2$) from the air. Leakage of air is held to a minimum to avoid oxygen-stabilized color centers in ingots of alkaline earth fluorides, and others. Carbon monoxide (CO) and $CF_4$ should be more soluble in these melts than hydrogen ($H_2$).

In a platinum crucible, the ingot shrinks after it solidifies but still adheres to the inner surface of the platinum crucible, contracting not only the sides but also the bottom of the crucible. This is the reason why the platinum crucible is heated sufficiently to free the ingot so that its contraction will not crack it. Just the contraction during growth shrinks the platinum crucible so that it must be rolled on a mandrel to stretch it to its initial size before it is reused. I concluded that the more uniform and better heat transfer through the walls and bottom of the platinum crucible was the reason why an ingot grown in a platinum crucible was substantially free from "sparkles" caused by gas inclusions. Also, adhesion of the solidifying ingot to the platinum prevents any movement inside the ingot during its growth.

It should be noted that an ingot grown in a platinum crucible may have other, non-gas derived inclusions, also referred to as "sparkles", generated by the intense radiation of the "remelt furnace" (used specifically to remelt the adhering surface of the ingot) when, after the platinum crucible is removed, the ingot continues to be heated. Such sparkles are the result of the recrystallization of a small volume of melt generated within the solidified ingot by radiant heat. Such "non-gas derived" sparkles are visually distinguished from those caused by gas inclusions; non-gas derived sparkles appear as 8-pointed "stars", the points radiating in the 1,1,1 directions, and have no flat facets. This is attributable to their having formed so fast they did not have time to grow facets.

Another kind of "sparkles" commonly found near the bottom of an ingot are platinum sparkles which are very small, about 1–5 $\mu$m, formed as a metallic moss. Their location alone sets them apart from gas-induced, or typical non-gas derived sparkles. Such platinum sparkles would not be expected in ingots grown in graphite crucibles but for the fact that platinum is used in the preparation of growth stock.

Since solidification of even a relatively small ingot is very slow, the bottom of the charge in the crucible becomes solid, giving form to the ingot while the upper portion of the charge is still molten and tightly held within the upper portion of the walls of the crucible because the upper portion is not cool enough to shrink. The growing ingot, upon cooling sufficiently, contracts and becomes spaced apart from the graphite floor. When the upper portion is finally cool enough to shrink, the ingot falls and rests on the floor of the graphite crucible. The timing of this "ingot drop" is unpredictable. The result is that in the initial portion of growth of the ingot, its bottom is in contact with the graphite bottom of the crucible affording excellent and predictable heat transfer; in the intermediate portion of the growth, the bottom of the ingot is spaced apart from the graphite floor of the crucible resulting in poor but predictable heat transfer; and in the last portion of the growth the bottom of the ingot is again in contact with the floor of the graphite crucible affording excellent heat transfer. The unpredictability of when the heat flow changed results in poor control of growth and inclusion of gas.

As indicated above, transversely spaced apart indentation means adapted to support an ingot near its edges and maintain its bottom in spaced apart relationship with the floor of the crucible, is an effective means to control the temperature gradient through the solidifying ingot and such control is found to minimize sparkles. Another means for obtaining the controllable temperature gradient is to configure a graphite crucible so that an ingot grown from a shrinking melt is continuously in contact with the floor of the crucible, instead of spaced apart from it. Such configuration provides an equally effective solution to the problem of sparkles due to gas inclusions in an ingot. In either case, controlled solidification is maintained slowly enough to allow gas molecules to diffuse out of the lattice being formed, and upwards out of the melt.

SUMMARY OF THE INVENTION

It has been discovered that when a macrocrystal is grown from a shrinking melt in a crucible having an inner surface which is not wetted by the melt, solidified melt shrinks away from and separates from the sides and bottom of the crucible. After initial solidification causes this separation, it forms a barrier against flow of heat out of the bottom of the crucible while the rest of the crystal is being formed. The separation reduces the temperature gradient in the crystal already grown; a steep temperature gradient causes strain or lattice slippage which affects the optical quality of the solidified crystal. More uniformly controlled, and therefore better, cooling is obtained if the macrocrystal is grown in a smooth-walled cylindrical crucible with non-wetted walls, and the solidified rnacrocrystal comes to rest on the bottom of the crucible; but by then the damage is done because the gradient could not have been controlled. A gap between the bottom of ingot and the crucible is not inherently harmful unless the gap changes rapidly and affects the rate of growth. More uniformly controlled, and therefore better, cooling is not obtained if the crystal is grown in a crucible with a cylindrical upper portion and a tapered lower portion, tapered downward, and with non-wetted walls, because the solidified macrocrystal slides towards the bottom until it is supported by the stepped circumferential shoulder of the crucible's conical bottom, leaving a gap between the lower surface of the crystal's conical bottom, and the corresponding conical surface of the crucible's bottom. By "tapered downward" is meant that the upper portion of the crucible is wider than the lower portion. Again, the damage is done because in either case, the ability to cool the solidified crystal and reliably maintain a controllable temperature gradient between the regions at the boundary of the melt, is jeopardized.

No portion of, or horizontal plane in, a conventionally grown Stockbarger ingot of sufficient diameter and mass to drop to the shoulder of a conical-bottomed crucible, remains at all times in the same horizontal plane with respect to the crucible in which the ingot was grown. Sudden change of the relative positions of a horizontal plane through the ingot and the crucible adversely affects growth of the ingot, which growth is still not complete.

However, transversely spaced apart indentation means including grooves or serrations in the walls of the novel graphite crucible provide effective heat transfer control because the bottom of a solidified ingot remains spaced apart from the interior floor of the crucible, avoiding the sudden shiLft of weight caused by a falling ingot. Effective control of heat transfer to provide the appropriate temperature gradient minimizes the formation of sparkles in an ingot grown so as to have its bottom spaced-apart from the crucible's floor. Moreover, maintaining a gap under the ingot reduces the increase in power needed to provide directional cooling, and results in reduced strain within the crystal because there is less of a temperature gradient within the solid crystal. It follows that a novel finished ingot will be directionally solidified as it grows in a vertical direction and have protuberances formed by the reverse impression of indentations in the sidewalls, which protuberances hold a phantom fixed horizontal plane within the ingot in a stationary position relative to a plane through the crucible; and ridges are formed on the bottom of the ingot as reverse impressions of grooves in the bottom, which ridges aid or direct the spread of a component. The protuberances and ridges are at least 50 $\mu$m high, and preferably range from about 0.8 mm to about 4.7 mm.

It has also been discovered that grooves or serrations in the floor of a graphite crucible in which an ingot is grown from a melt in a Stockbarger furnace, the grooves preferably being directed in the same directions favored for growth by the crystal lattice to be grown, produces a minimal number of multiplicities, if not an ingot which is an essentially single crystal. Such grooves in the floor of a conventional graphite crucible are effective to produce an essentially single crystal ingot. The object is to cover the bottom of the ingot with a grid of dendritic needles growth of which is oriented by a seed, or preferably starts spontaneously with a selection process for the fastest propagation which excludes the growth or overrides the growth of multiplicities. Grooves at least 50 Am deep are preferred, more preferably at least 0.8 mm (0.03125 in) and up to about 4.7 mm (0.1875 in) deep. Scratches less than 50 $\mu$m deep, or rubbing the bottom surface of a crucible can align epitaxial growth of crystals but grooves allow the melt at the bottom to be cooler than with scratches, and more susceptible to dendritic growth of any orientation.

A novel macrocrystal ingot grown from a halide melt in a carbon or graphite crucible under earth's gravity is essentially free from gas-induced sparkles in the upper half of the grown ingot disregarding flaws near the top, that is in the topmost portion while the ingot was growing. Typically in an ingot having an effective diameter of at least 15 mm, the uppermost 5 mm is disregarded; and minimizing the number of multiplicities produces less than half the number of multiplicities compared to the number present in an ingot of the same salt grown from an equivalent mass of crystals of the same size in a conventional crucible of the same size and shape, except with a smooth floor. For evident reasons, it is preferred to combine the grooves in the floor of the crucible with a configuration which will afford better control of the temperature gradient than is afforded by a conventional crucible, and thus also minimize the formation of sparkles.

It is therefore another general object of this invention to provide a crucible with a grooved or serrated bottom surface, the grooves or serrations either (i) running parallel to each other in only one direction, or (ii) running parallel to each other in either two or three directions at an angle, one parallel set being typically at either 60°, 72° or 90° to the other parallel set, the angle chosen depending upon the desired direction of crystal growth propagation; preferably growth is in the 100 direction, but if seeded, may be in the 111 direction; though the side elevational profile of a groove is not narrowly critical, the sides of each groove are preferably angulated rather than vertical, to facilitate separation of the crystallized bottom surface of a crystal.

It is therefore a general object of the invention to provide a crucible in which the walls support the weight of a directionally solidified macrocrystal, irrespective of the geometrical shape of the interior of the crucible; because it is critical that the melt fails substantially to wet the walls of the crucible, the weight of the growing crystal is supported by the walls of the crucible, the separation between the lower surface of the macrocrystal and the bottom of the crucible is maintained, and loss of heat through the bottom of the crucible is controlled. By securing the crystal in the novel crucible so that a horizontal plane through the ingot cannot move relative to the corresponding plane through the crucible, upon solidification, all movement related to contraction of the melt will be as slow as the growth process, and under the control of the operator, by adjusting power and furnace temperature.

It is a specific object of this invention to provide either a unitary (or monolithic), or a disassemblable crucible made of a material inert with respect to a melt to be solidified, the material having a melting point substantially greater than that of the melt; the crucible is preferably of graphite or carbon, or a substitute for either, able to withstand temperatures required to melt the material to be grown; the crucible's walls which are essentially non-wetted by the melt, have indentation means to support a grown ingot; the configuration of the indentations is such as to provide sufficient support for the weight of solidified melt in a region below the indentations. An indentation means may be a generally lateral projection (referred to as a "step") from the interior surface of the crucible, or it may be a channel-like recess (referred to as a "channel") formed in the interior surface. The lateral width of a step or channel is empirically selected to be in the range from about 0.1% to about 1.5% of the diameter of the crystal, preferably about 1%. When the macro-crystal grown is not circular in cross-section at its widest dimension, the term "diameter" refers to the widest dimension of the macrocrystal. Graphite and carbon are practical materials for a crucible and may be coated with pyrolitically deposited carbon to decrease pore size.

Because it is not possible to see what is occurring while the crystal is growing, a crucible having indentations in its inner walls to support the weight of the growing crystal provides the advantage of being able to fix a level in the growing ingot relative to a plane through that level in the crucible, and to predict the power requirement as a function of time at each point during the growth of an ingot; and to repeat a cycle for reliably growing desirable ingots.

It is a specific object of this invention to provide a crucible in which the bottom is provided with patterns of twin sets of grooves in each semicircle of the bottom, the pattern in one semicircle being spaced apart from the other by a small distance in the range from 1 mm to about 1 cm, so as to grow side-by-side single crystals in the ingot.

It has also been discovered that "sparkles" caused by gas inclusions may be unexpectedly minimized if not essentially negated by growing an ingot of an alkali metal halide or an alkaline earth metal halide in a graphite crucible configured to maintain the bottom of the growing ingot in intimate contact with the graphite bottom of the crucible until the ingot is fully formed; the floor of the crucible is provided with one or more grooves or serrations; the walls are relatively smooth and substantially free of indentations deep enough to support the weight of a cooling ingot; such walls near the bottom of the crucible, whether polygonal or arcuate, typically either rectangular or cylindrical, may be (i) geometrically uniform; or (ii) "tapered" (or "tapered downwards"); or (ii) or "reverse tapered" (or "tapered upward"); the shape of crucible chosen depending upon the choice of temperature gradient one seeks to control in the crucible. By "geometrically uniform" is meant that the crucible has the same cross-section, and the walls have the same geometrical configuration, from top to bottom. The bottom of a typical Stockbarger crucible is conical and referred to in the art as being "tapered", meaning "tapered downwards", the cross-sectional area decreasing downward. By "tapered upward" or "reverse tapered" is meant that the cross-section increases downward, the walls being tapered upwards, the cross-sectional of the graphite bottom surface being greater than that immediately above the bottom surface; the effect is to control growth and eliminate erratic heat transfer. Configuring a graphite crucible so that an ingot grown from a shrinking melt is continuously in contact with the bottom of the crucible provides an effective solution to the problem of sparkles due to gas inclusions in an ingot.

BRIEF DESCRIPTION OF THE DRAWING

The foregoing and additional objects and advantages of the invention will best be understood by reference to the following detailed description, accompanied with schematic illustrations of preferred embodiments of the invention, in which illustrations like reference numerals refer to like elements, and in which.

DETAILED DESCRIPTION OF PREFERRED EMBODIMENTS

It is preferred, in a first embodiment, to use: the same or comparable 9RL grade graphite manufactured by Airco Carbon after the crucible is cleaned with a 44% HI solution, rinsed with deionized water, and heated to 400–500° C. for a full day to dry the crucible. In this first embodiment in which the ingot is held spaced apart above the floor of the crucible, it has a generally trapezoidal or conical bottom, tapered downward, the width of the bottom being less than that of the top of the crucible, primarily due to considerations of s;trength.

It is preferred, in a second embodiment, to use the same or comparable 9RL grade graphite treated as before, to grow an ingot substantially free of "sparkles" in its upper portion, that is, above the ingot's median height, preferably using a crucible with a serrated bottom in which, at least one set of parallel grooves is cut; preferably, two sets of intersecting grooves are used, a first set of grooves being angled complementarily to a set of second grooves. By "substantially free of sparkles" is meant that the number of sparkles visible to the naked eye do not substantially detract from the performance characteristics of the ingot.

Figure 1:
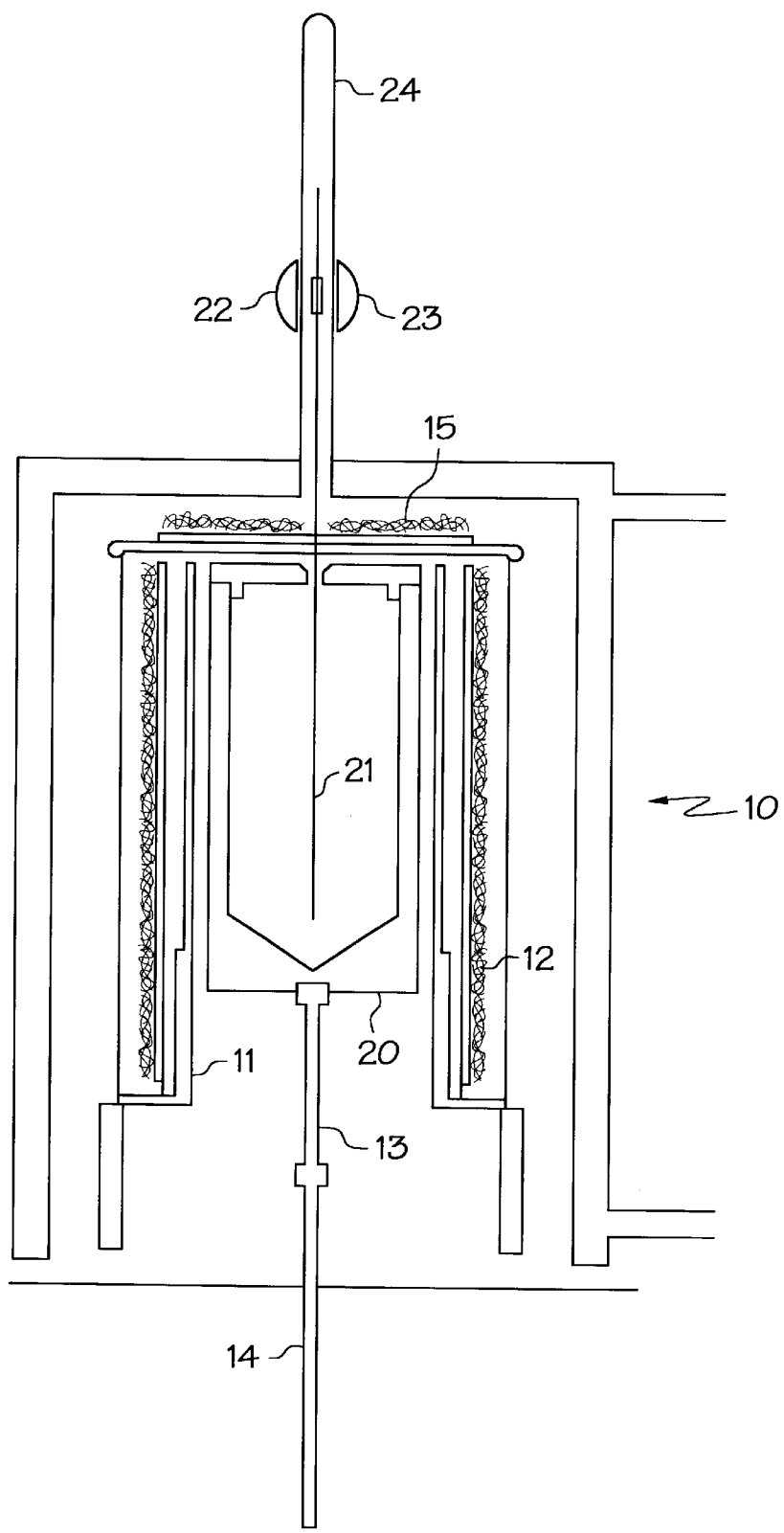
FIG. 1 is a generally schematic view of a typical prior art furnace in which a graphite crucible is used to grow a miacrocrystal.

Referring to FIG. 1, there is diagrammatically illustrated a furnace referred to generally by reference numeral 10, in which is reciprocably held a crucible 20 charged with substantially pure small crystals of an aforementioned halide, e.g. calcium fluoride ($CaF_2$) with from 2% to 4% by weight of lead fluoride ($PbF_2$). The crucible is specifically designed for the growth of macrocrystals larger than about 7.5 cm, and preferably for crystals larger than about 30 cm in diameter at its largest diameter. A larger crystal may be grown, as large as 80 cm wide or more, at its widest dimension in the lateral direction, the limit being determined by the size of the furnace one can build, and the cost of constructing a crucible of that size. The emphasis is on growing an ingot in a crucible having at least one interior dimension greater than 7.5 cm, and, the interior surface has two transversely spaced apart indentations having a configuration adapted to support the macrocrystal near its edges and maintain the macrocrystal's bottom in spaced apart relationship with said crucible's bottom. Such a crucible allows one to grow an ingot with a large diameter; the height of an ingot is arbitrary, depending upon the depth of melt in the crucible and the height of the furnace. The height of an ingot is typically in the range from about 7.5 cm to 30 cm.

The material of a preferred crucible is heat resistant and thermally conductive, such as microporous graphite or carborn having a pore size too small to allow penetration of a particular melt being solidified. The graphite may be coated with glassy carbon by techniques well known in the art, the requirement being that the crucible formed is dense enough to prevent leakage of the melt, that is, essentially impermeable to the melt. The lower the surface tension (dynes/cm) of the melt, the higher is the required density of the graphite.

A crucible made from graphite of appropriately high density may be sectioned, and the mating surfaces of the sections machined smoothly enough that when reassembled, the crucible behaves like a monolithic crucible, and does not leak. A crucible larger than about 30 cm in diameter may be constructed with circumferentially segmented sections having dove-tailed sides which are interfitted in the vertical plane. The dove-tailed boundaries are preferably cemented with graphite. The surface tension of the melt used is high enough that the melt will not seep through the interface of abutting sections. This physical phenomenon is used to construct crucibles which can be taken apart to remove the ingot grown in it, and because the crucible is disassemblable, the shape and the size of the ingot grown may be arbitrarily chosen.

Typical melts and their surface tensions are as follows:

| Salt | Temp. ° C. | dynes/cm |
| --- | --- | --- |
| NaI | 700 | 85.6 |
| CaI | 654 | 73.1 |
| KCl | 800 | 95.8 |
| NaCl | 803 | 113.8 |
| NaF | 1010 | 199.5 |
| LiF | 868.5 | 249.5 |
| $PbF_2$ | 855 | (185) |
| $CaF_2$ | 1330 | (255) |
| $BaF_2$ | 1280 | (369) |

The extent of shrinkage upon crystallization depends upon (i) the width of the crystal grown in the lateral plane in which the crystal is to be supported, the width being greater than the distance between opposed points of support; and (ii) the coefficient of expansion of the material crystallized. Calculating the extent to which each indentation or step should protrude into the crucible from known coefficients of expansion, it will be evident that extent will be in the range from about 0.05 mm to about 5 mm depending upon the diameter of the crystal.

Furnaces for the growth of large crystals have two positions for the growth of the interface for each power level. Also the power needs to be increased as growth proceeds. The change from a smooth hard interface to dendritic trees can make as much as 60 mm difference in probe readings for the same power level if in some way the residual melt is stirred. The rate of crystallization for dendritic needles is orders of magnitude greater than the rate for formation of a smooth interface, sometimes about 1000 times greater. This speed is used to spread solid and avoid the start of separate components and minimize flaws in the ingot.

Some flaws at some boundaries between components are evidenced by:

(1) A "veil" of rectangular negative crystals, voids about 100 $\mu$m at an edge, which do not strain the surrounding solid (lack of strain is visible with polarized light). Such voids result when a horizontal "bubble pipe" has moved up just below the growth interface at a boundary between components. (2) Component boundaries may be mechanically sound but reflect some light when a veil of very small dust particles about 1 $\mu$m in size, accumulate in the boundaries. Thermal shrinkage in such a case causes small cleavages around each dust particle. The amount of light reflected from boundaries of the cleavages greatly amplifies their size. (3) In a doped crystal, when the rejection ratio is high, typically in the range above 25, and particularly when greater than 50, dopand will accumulate at some boundaries between components. This accumulation reduces the melting temperature at the boundary enough to allow liquid to flow out of the ingot if the ingot is "melted out" of a crucible. Such flow out of the ingot may leave an opening about 2 mm wide in the ingot.

Within insulated walls 12 of the furnace are electrically heated coils 11 surrounding the crucible 20 which is supported on a. vertically reciprocable graphite shaft 13 which is coupled to a water-cooled stainless steel shaft 14. The lower portion of the crucible terminates in a cone-shaped bottom; the apex of the cone being in the cone's lowest location, the bottom is tapered downward. An insulated cover 15 over the insulated walls 12 sealingly enclose the interior of the furnace. The interior of the furnace is flooded with an inert gas maintained under reduced pressure. Typically a getter is added to the crystalline charge in the crucible and the contents melted. A probe 21, controlled by opposed magnets 22, 23 on either side of a glass tube 24, is lowered into the crucible so that its tip can "feel" when crystallization commences. The crucible is then moved downwards under controlled conditions of temperature to establish a localized zone in which crystallization occurs; this zone is moved upwards as the crucible is moved downwards on shaft 13 until all the melt soldifies into an ingot. The construction of the furnace is conventional and forms no part of the invention claimed herein.

At plural locations, as the crucible is being lowered, the power to the heating coils must be modulated to maintain the solidifying surface of the melt at a chosen level either by decreasing or increasing the power to the coils. Such adjustment must be made long before the effect of the adjustment can be registered by the tip of the probe 21. When the ingot is fully crystallized it shrinks in the range from about 0.05% to about 2%, typically about 0.1% radially and vertically, depending upon the crystalline material. The foregoing is routine procedure for growing a crystal by modulating the power to the coils relying on the experience of a previous run; except that any shift in the position of the crystal which is different from the shift in the one grown before, results in incorrect modulations and an undesirable crystal.

Figure 2:
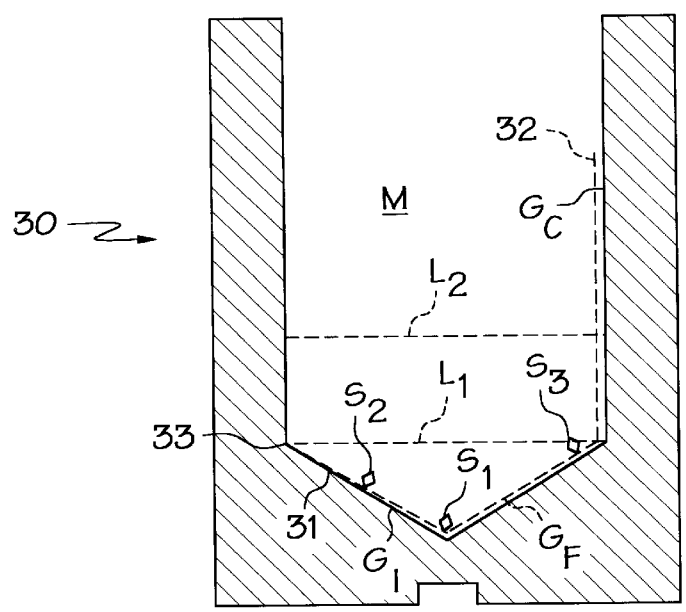
FIG. 2 is an enlarged view of a prior art conical-bottomed crucible conventionally used in the furnace shown in FIG. 1.

Referring to FIG. 2 there is shown an enlarged cross-sectional view of a conventional crucible 30 of dense graphite not wetited by the melt M, the crucible having a conical bottom 31 with downwardly tapered surfaces meeting the vertical walls 32 at a circumferential shoulder 33. Crystallization typically starts in the apex of the cone at S1, though other seeds S2, S3 etc may initiate growth at points in the conical bottom surface and eventually generate boundaries which may run in the same direction, generally vertically in the macrocrystal to be formed. As the localized zone of crystallization rises into the shoulder 33 to a level represented by phantom line L1, the conical bottom portion of the crystal separates from the bottom surface 31 and the weight of the melt and that of the crystalline conical bottom is supported on the shoulder 33, leaving an initial gap (shown enlarged) Gi shown around the surface of the cone. This gap Gi is wedge-shaped, closing at the shoulder where the crystal is supported, while the melt in contact with the upper portion of the wall of the crucible continues to crystallize. As crystallization continues and the localized zone rises to a level represented by phantom line L2, the crystal continues to shrink isotropically (in each direction) and when crystallization is complete, the entire circumference of the crystal shrinks producing a final gap on the bottom, the final gap around the surface of the cone being indicated by Gf on the right hand side of the cone. Since the circumferential shrinkage of the cylindrical upper portion of the ingot produces a circumferential annular gap Gc, the ingot is no longer supported at the shoulder and falls into contact with the conical bottom 31.

Since one cannot see or otherwise determine at what point in the growth of the ingot the radial shrinkage of the upper portion of the ingot is sufficient to drop the crystal to the bottom of the crucible, it will be evident that one cannot determine the rate of heat transfer from the lower portion of the crucible. If either the initial gap Gi or the final gap Gf could be maintained after it is formed, then the rate of heat transfer from the bottom can be determined by a little trial and error such as one skilled in the art is accustomed to do. Once determined, the rate will be identical for each ingot grown from a melt of the same salt, in the same crucible, in the same furnace.

Once the upper portion of the melt crystallizes, circumferential shrinkage precludes the initial gap Gi being maintained, but with the novel configuration of the crucible described herein, the final gap Gf can be maintained. This is accomplished when the wall of the crucible is indented or stepped, sufficiently to bear the weight of the crystal.

Figure 3:
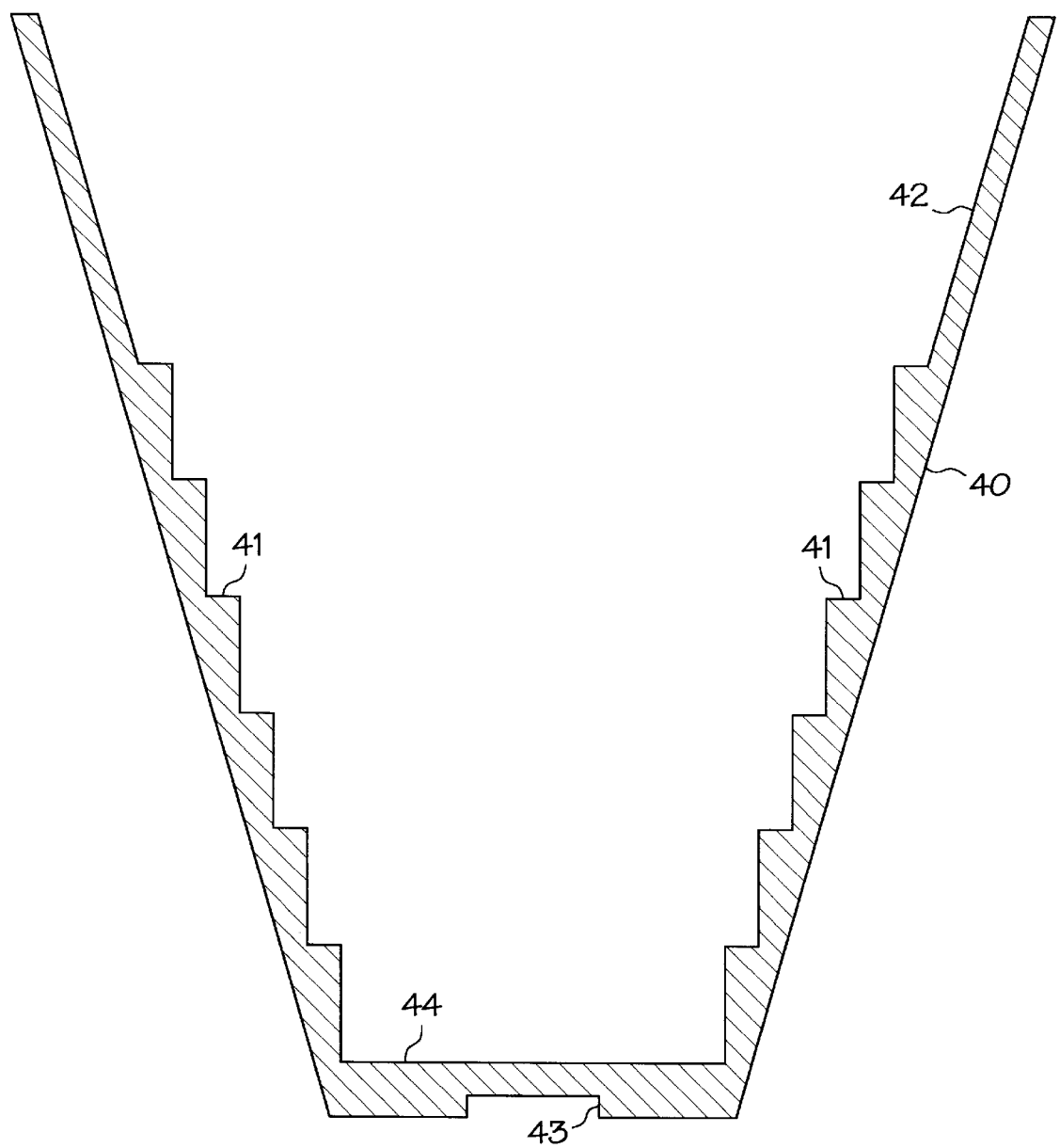
FIG. 3 is a sectional view of a crucible having a frustoconical bottom with a tapered wall having stepped indentations ("steps") in the form of circumferential steps cut into the interior surface. The term "indentation" is used to refer broadly to any projection or recess in the wall of a crucible able to support the ingot to space its bottom away from the bottom of the crucible; the term "step" indicates that the ingot may be removed without disassembling the crucible; the term "recessed indentation" or "channel" is used to indicate that the crucible must be disassembled when the ingot is to be removed.

Referring to FIG. 3 there is diagrammatically illustrated a frustoconical crucible 40 with successive vertical steps 41 formed in the interior surface of the conical wall 42. The bottom of the crucible 44 is typically much thicker than the walls of the crucible to provide adequate strength; the bottom is provided with a central recess 43 adapted to have snugly fitted therein the top of the shaft 13. For a relatively small ingot in the range from about 10 cm to about 20 cm at its maximum width, a single step intermediate the top and bottom of the grown crystal may suffice, but plural steps are preferred for larger crystals, the number of steps depending upon the size. For crystals larger than 20 cm in diameter, in the range from 2 to 10 steps may be used. In each case, the crystal is supported so as to leave a reproducible gap between the bottom of the crystal and inner surface of the bottom of the crucible. If desired a seed crystal holder (not shown) is provided in the bottom. After the crystal is grown, it rests on the steps having pulled free of the interior wall, so that the crystal can be lifted straight up and out of the crucible.

Circumferentially continuous steps are easily machined but the steps may be discontinuous; furthermore the length of the circumferential arc over which a step extends is not narrowly critical as long as it provides the desired support for the ingot grown. For practical reasons steps are provided on opposed walls to provide balanced and maximum support, but the steps may provide adequate support if they are only circumferentially spaced apart in the same lateral plane of a cylindrical or frustoconical crucible. The steps may also provide adequate support if they are spaced apart in offset lateral planes, one plane above the other; if so spaced apart, it is evident they will provide optimum support if they are directly opposed to one another. Thus when a rectangular ingot is grown, it may be supported at adjacent sides, but will preferably be supported at opposed sides. Similarly, when a cylindrical or frustoconical ingot is grown it is preferably supported on at least two steps 41 and 41' (see FIG. 6), or supported in channel-like recesses, diametrically opposite from each other. The distance to which the steps 41, 41' protrude into the interior of the crucible will be in the range from about 0.1% to about 1.5% of the distance between the steps, the protrusion depending upon the shrinking melt being grown, and the location of the steps relative to one another. The ingot may also be adequately supported if the two indentations were not diametrically oppositely disposed, that is, one indentation is laterally spaced apart from the other within another quadrant as are steps 42' and 42" in FIG. 7, and the second support may be in the same lateral plane of different. Preferably the crystal will be supported at three laterally spaced apart indentations, as shown at 42, 42' and 42' in FIG. 7. Thus it is seen that adequate support may be provided as long as there are at least two indentations which are transversely spaced apart in the interior surface of the crucible. Most preferably an ingot is grown in a frustoconical crucible such as in shown in FIG. 3, which crucible is provided with a continuous circumferential step forming a ring in the interior surface.

Figure 4:
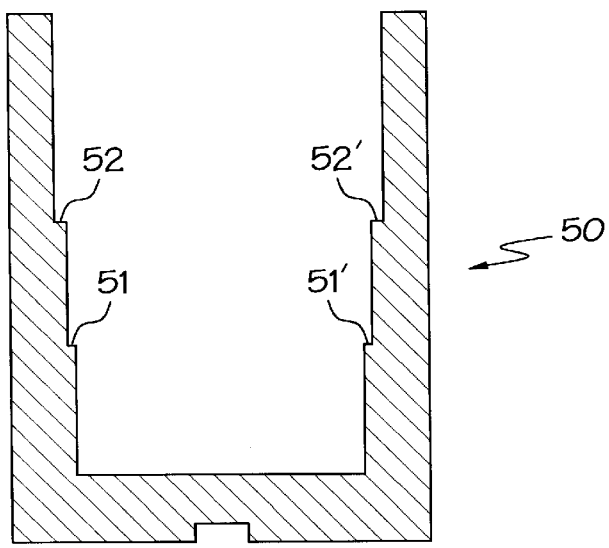
FIG. 4 is a sectional view of a generally cylindrical crucible having stepped indentations in the form of circumferential steps cut into the vertical walls.

Though a cylindrical ingot is typically grown in a crucible illustrated in FIG. 2, or a frustoconical ingot is grown in one illustrated in FIG. 3, it is now possible to grow a rectangular ingot if desired. Referring to FIG. 4 there is shown a vertical sectional view of a box-shaped crucible 50, the interior of which is the shape of a rectangular parallelpiped, except that opposed walls are symmetrically stepped, the opposed walls having coplanar steps 51 and 51' of the same height and protruding into the interior to about the same extent, directly opposed to one another; these steps may extend for only a short distance in the range from about 5 mm to about 10 cm along a wall, or the steps may be coextensive with each opposed side. If desired, additional steps 52, 52' may be provided, each protruding inwardly to support the growing ingot, provided the steps 52, 52' do not interfere with removal of the crystallized ingot. As before, the disposition of the steps is not critical so long as the ingot is supported so as to leave a substantially reproducible gap between the bottom of the crystal and inner surface of the bottom of the crucible.

As with the crucible illustrated in FIG. 3, it is not critical that the steps 51, 51' in the sides of the crucible 50 be coplanar to provide adequate support; they may be staggered, that is vertically offset, one in a lateral plane above the other.

Figure 5:
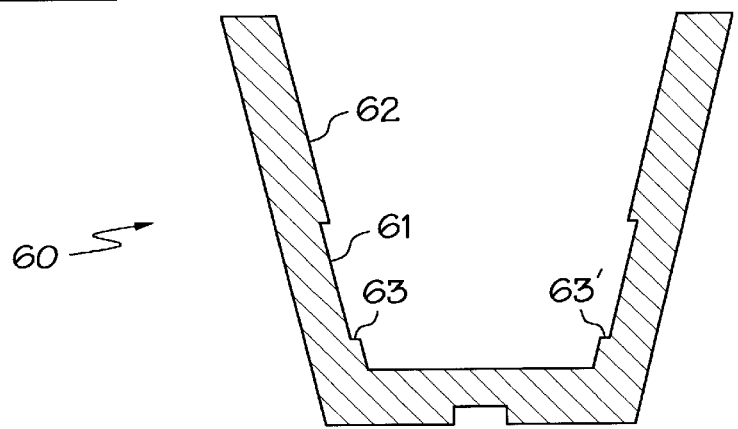
FIG. 5 is a sectional view of a crucible having a frustoconical shape in the tapered interior wall of which a single circumferential indentation or channel is provided.

In each of the crucibles illustrated in FIGS. 2, 3 and 4 the ingot may be removed without disassembling the crucible, simply lifting the ingot out. Referring to FIG. 5 there is shown a side elevational view of one-half of a frustoconical crucible 60, the other half of which is in mirror-image relationship with the one-half. The mating surfaces of each half of the crucible are smoothly polished so they may be held together tightly enough not to allow melt to seep through. Alternatively, the sides of each half may be dovetailed so they can be interfitted in fluid-tight connection, the fluid being melt. Each half has a circumferential, recessed indentation or channel 61 formed in the conical surface of the interior, the steps 63 and 63' being sized to support the crystal and maintain a bottom gap after the bottom has crystallized. The height of the channel 61 above the bottom of the crucible is not narrowly critical and the channel may extend for only a portion of the circumference, sufficient to provide the support needed. The main advantage of using a disassemblable crucible 60 with a channel 61 is that the walls of the crucible do not have to be as thick as they would be if the crucible was stepped.

To grow a very large ingot, greater than 50 cm in its widest dimension, it may be desirable to divide the crucible into several interfittable sections, irrespective of the shape of the crucible. It will be evident that a cylindrical, frustoconical or rectangular crucible may be each be sectioned in the vertical plane to provide sections of practical size and excellent quality, and these can be assembled in fluid-tight connection to grow an ingot of arbitrary size limited only by engineering and economic considerations.

Though a crucible which supports the crystal as it grows, leaving a gap in the bottom, provides excellent ingots, even better ingots are obtained if the bottoms of the crucibles are grooved. The term "grooved" is used herein to indicate that how the bottom is "scored" or "serrated" is not critical as long as the profile does not bind the crystal to the bottom. A single groove has a directive effect and will be found to be beneficial, but for obvious reasons, it is preferred to use at least one set of a multiplicity of grooves in parallel relationship with each other.

Figure 6:
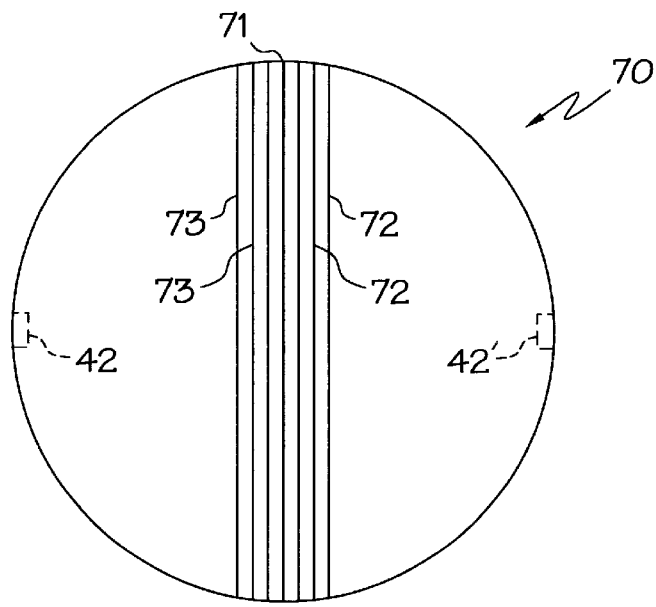
FIG. 6 is a top plan view of the bottom of a frustoconical crucible showing multiple parallel grooves or serrations, each having a triangular profile (in side elevation) cut into the bottom which is sloped, each groove extending across it.

Referring to FIG. 6 there is shown a plan view of the circular bottom 70 of a frustoconical crucible such as shown in FIG. 3 which is provided with at least one set of grooves, the central groove 71 lying along the diameter of the bottom, and others 72 and 73 running parallel to groove 71, on either side thereof. The grooves may extend over only a portion of the bottom, but to grow a single crystal, they preferably cover the entire bottom. Grooves range in depth from about 0.8 mm to about 4.7 mm, preferably from about 1.6 mm (0.0625 in) to about 3.2 mm (0.125 in).

As an alternative to machining grooves, the bottom of the crucible may be coated with a thin coating of graphite cement in the range from about 0.8 mm to about 3.2 mm thick; the coating is then grooved before the crucible is fired in vacuum to develop a permanent bond. After firing the crucible it is preferred to remove impurities with a purification treatment, avoiding the use of nitrate or nitric acid which tends to form a graphitic oxide and make the surface wettable. Using a coating of graphite is particularly desirable in a sectioned crucible, to seal its bottom against leakage.

Figure 6A:
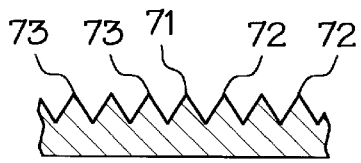
FIG. 6A is an end elevational detail view of multiple triangular grooves across the bottom of a crucible.
Figure 6B:
FIGS. 6B, 6C, 6D and 6E are detailed views of some other profiles of grooves which function similar to those shown in FIG. 6A.
Figure 6C:
Figure 6D:
Figure 6E:

Referring to FIG. 6A there is shown a detailed view of an end elevation of the grooves illustrated in FIG. 6. The grooves are provided by a series of triangle-shaped ridges 71, 72, 73 which help direct the propagation of crystallization and enables a shrinking melt to form the crystallized bottom of an ingot which pulls away from the bottom of the crucible. Though the angular disposition of the grooves relative to the diameter of the bottom directs crystal propagation, it is important that their side elevational profile be such as to allow the crystallized bottom to pull away from the troughs of the grooves without being bound therein. Most preferred is a profile of grooves shown in FIG. 6A as isosceles triangles; any triangular profile is effective unless one of the sides is vertical as shown in FIG. 6B, when the vertical edge of the triangular groove tends to hold the crystal tightly and fracture either the crystal or the crucible. Other profiles for grooves are illustrated in FIGS. 6C–6E. FIG. 6C illustrates sequential cusps; FIG. 6D illustrates a waviy profile; and FIG. 6E illustrates crenelations separated by V-shaped (not shown) or U-shaped (shown) grooves.

More preferred than a single set of parallel grooves are twin sets of grooves angulated with respect to each other at an angle chosen in light of the lattice structure of an ingot to be grown. $CaF_2$, lithium fluoride (LiF) and sodium chloride (NaCl) are all cubic, but $CaF_2$ favors growth in the 100 direction while LiF and NaCl favor growth in the 111 direction. Magnesium fluoride ($MgF_2$) is tetragonal but close enough to fluorite, which favors growth in the 100 direction, referred to as the "C" direction in the tetragonal system.

Figure 7:
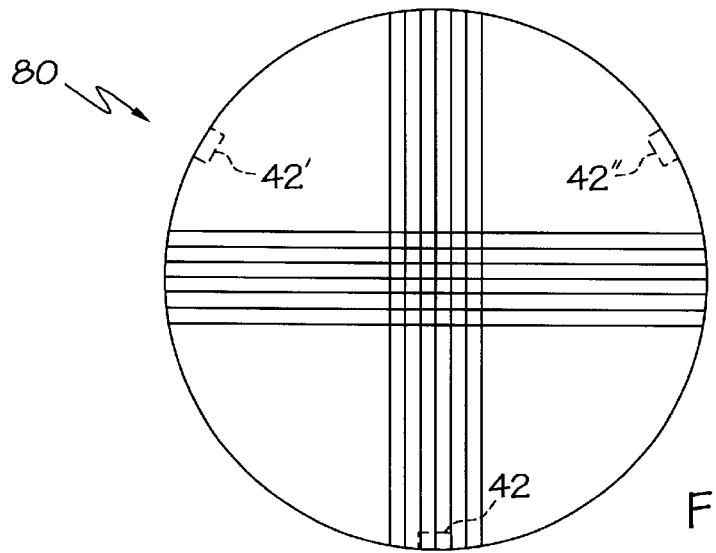
FIG. 7 is a top plan view of the bottom of a frustoconical crucible showing twin sets of grooves, each having a triangular profile (in side elevation), cut at right angles to one another.
Figure 8:
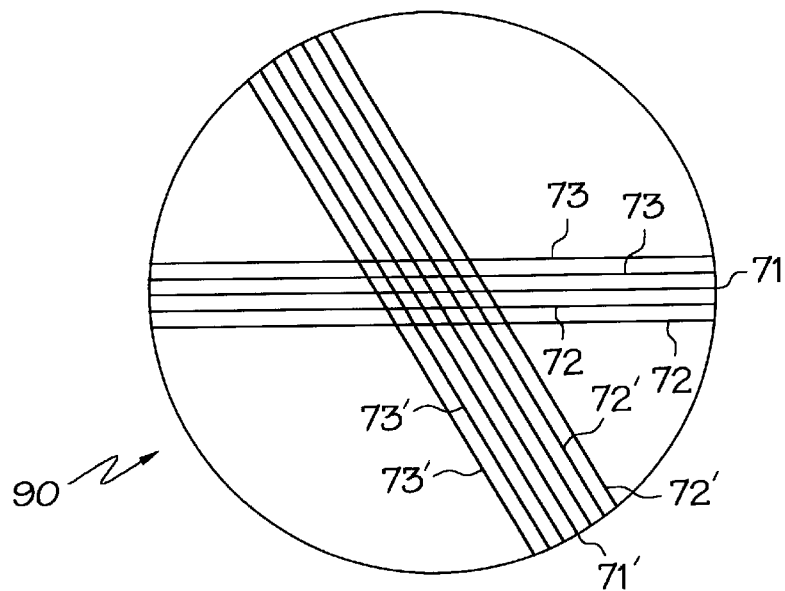
FIG. 8 is a top plan view of the bottom of a frustoconical crucible showing twin sets of grooves, each having a triangular profile (in side elevation), cut at an angle θ (theta) to one another.

Accordingly, as illustrated in FIG. 7, the bottom of the crucible 80 is provided with twin sets of grooves 71, 72, 73 and 71', 72' and 73', the sets being at right angles ($\theta=90°$) to one another for spontaneous seeding in the 100 direction. Spontaneous seeding is desirable because the melt can be overheated about 100° C. to drive off dissolved gases and $Pb^{++}$ which in $CaF_2$ absorbs at 200 nm; in $BaF_2$ the $Pb^{++}$ absorbs at 205 nm. Such absorptions diminish the effectiveness of the crystal as a laser window. As in FIG. 6, the profile of the serrations is not critical, nor is the angle $\theta$, though it is preferred to have an angle which favors growth of an essentially single crystal.

Where growth of a single crystal ingot is favored at 60°, the grooves are provided at that angle as illustrated in FIG. 8. The bottom of crucible 90 is provided with twin sets of grooves 71, 72, 73 and 71', 72' and 73', the sets being at an angle of 60° to one another. As in FIG. 6, the profile of the serrations is not critical.

For growth of an ingot from a seed held in a seed pocket provided in the bottom of the crucible, even a single groove or serration will start fast dendritic growth, but preferably plural grooves or serrations are especially beneficial. The angle of the grooves relative to each other, or relative to axes in the horizontal plane, is not important. Radially radiating grooves, or spiral grooves, or radially spaced apart circumferential grooves will each be beneficial.

Growing an ingot in a crucible having a bottom with twin sets of grooves as illustrated in FIGS. 7 and 8 will generally provide a single crystal ingot with mosaics in a choice of only three directions. If the ingot grown fails to have a desired mosaic specified for an X-ray plate, the ingot is un:Lsable for its intended purpose, and another ingot must be grown which might have a mosaic with the desired specification. Each time an ingot is grown in a crucible with only one set of twin angulated grooves, there is a choice of only three directions in which one can find the desired mosaic.

Figure 9A:
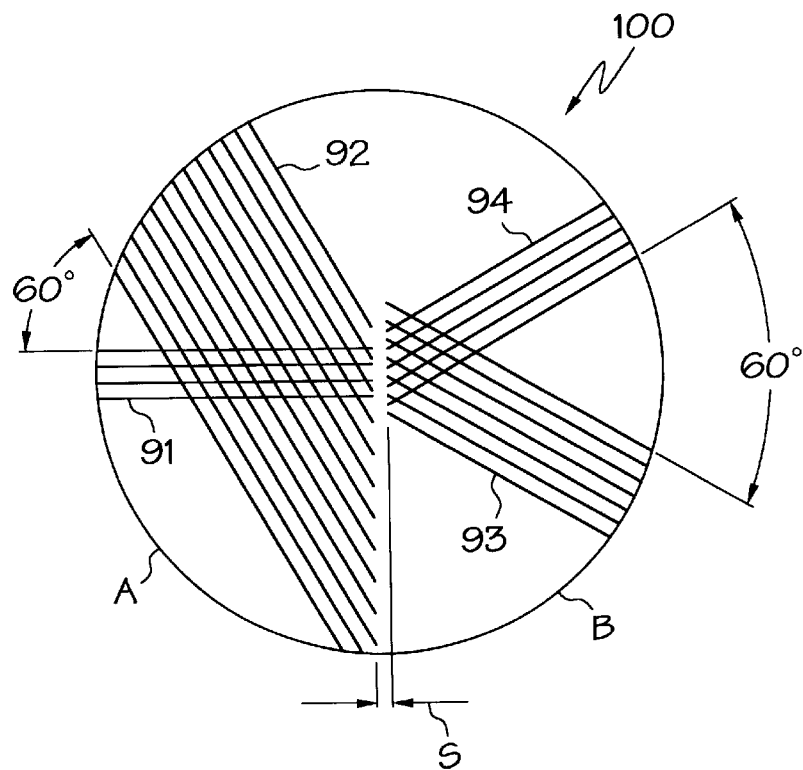
FIG. 9a is a top plan view of the bottom of a frustoconical crucible showing grooves cut in spaced apart patterns, each pattern in a semicircle comprising twin sets of grooves, each having a triangular profile (in side elevation), cut at an angle of 60° to one another.

Referring to FIG. 9a there is schematically illustrated a plan view of a grooved bottom of a crucible 100 in which two single crystals are grown, side by side, each single crystal favoring growth at $\theta=60'$ so as to provide a total of six directions for choices of obtaining the desired mosaic. Twin sets of grooves are provided in laterally spaced apart semicircular portions A and B of the bottom, spaced apart by distance 's' on the diameter. Grooves 91L, 92 in semicircle A are at an angle $\theta=60°$ to each other, as are the grooves 93 and 94 in the semicircle B, except that the grooves in each semicircle are inclined to one another at $\theta$ other than 60° so that the grooves in one set are staggered relative to the other, and therefore mis-matched. The relative angle at which the grooves in each set are staggered is not critical. Though the ingot is deliberately grown as separate single crystal halves, the ingot is optically integral and its contiguous lattices are differently oriented one relative to the other. Since each set of grooves provides a single crystal with a choice of mosaic in three directions, an ingot grown with side by side single crystals provides twice as many choices. Therefore if such an ingot is sawed in half along the boundary of the contiguous lattices, each half may be evaluated for mosaic spread by X-ray diffraction in various directions. Thus at least one half of the ingot is likely to have the desired mosaic spread.

As in FIGS. 7 and 8, the angle $\theta$ may be any angle in the range from 1° to 90°, but it is preferred to provide an angle which favors growth of a single crystal for the particular material being grown.

Figure 9B:
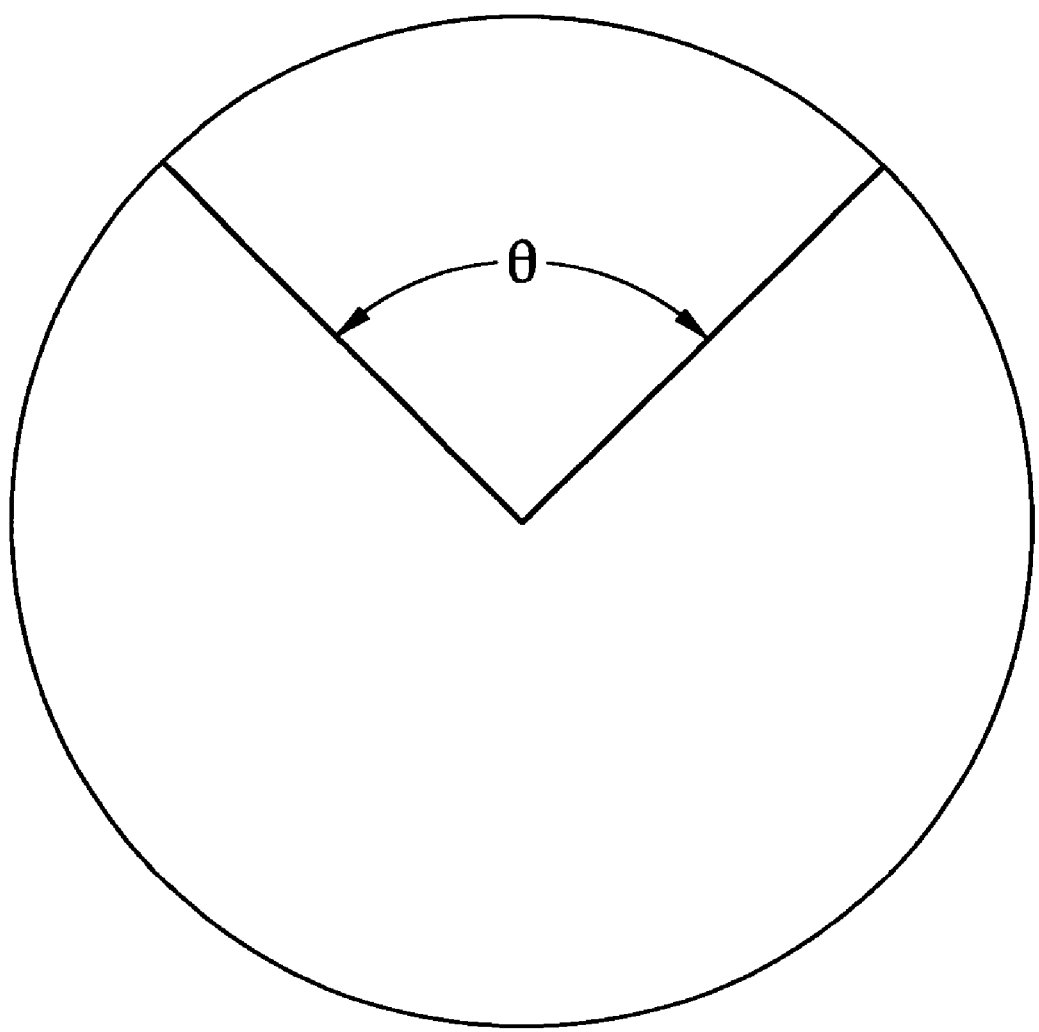
FIG. 9b is a top plan view of the bottom of a frustoconical crucible showing a single groove each having a triangular profile, one groove in each semicircle, the grooves being angulated relative to one another.

As illustrated in FIG. 9b, though less preferred, a single groove of arbitrary profile in front and side elevational views, in one half of the circular cross-section of the bottom, will favor growth of a single crystal; a single groove in each semi-circle will produce substantially the same result as the multiple grooves of FIG. 9a. As with the multiple grooves, the angle of one single groove relative to the other is not critical, and any angle $\theta$ may be used.

Using the crucible of this first embodiment of the invention it is now possible to practice a novel process comprising, charging a crucible with a halide of Group 1*a* and Group 2*a* element of the Periodic Table which halide forms a shrinking melt upon being sufficiently heated in a furnace, the crucible having transversely spaced indentations in the interior surface thereof sufficient to support a macrocrystal grown therein near its edges; causing slow movement of the melt relative to the furnace from a region hotter than the melt's crystallization temperature to a region cooler than the crystallization temperature; maintaining a temperature gradient in a localized zone between melt and solid; supporting a mass of partially crystallized melt on said indentations; and, forming an ingot having its bottom surface spaced apart from the interior bottom surface of the crucible.

EXAMPLE 1

A stepped crucible of dense 9RL graphite (obtained from Airco Carbon) having stepped walls of the general configuration illustrated in FIG. 3 is charged with 450 parts of $CaF_2$ and 10 parts of PbFZ crystals, by weight and placed in a furnace such as is illustrated in FIG. 1. The furnace is evacuated to a pressure of less than 0.1 mm Hg absolute, and heat is applied in the hot zone over an 18 hr period until all gassing ceases and the charge forms a substantially homogenous melt When crystallization commences the crucible is lowered slowly into a cooler zone at a rate of about 4 mm per hr and continued for about 24 hr, making adjustments for power requirements as necessary. The position of the probe at the interface remained essentially constant indicating that no sudden power requirements were necessary. At no time was there any indication that the growing crystal had moved within the crucible The elevator is then stopped and the temperature of the crucible allowed to cool to room temperature. The ingot is supported on the steps of the crucible and because the periphery of the ingot is not adhered to the walls, the ingot is lifted out of the crucible. The ingot is found to be clear and optically integral but contained several single crystals.

EXAMPLE 2

The interior surface of the bottom of a frustoconical crucible having smoothly tapered walls free of indentations, and made of the same 9RL graphite as before, is machined so as to cover the entire bottom with twin sets of triangular grooves shown in FIG. 6A, at right angles to one another as shown in FIG. 7. The crucible was charged with a $CaF_2$/$PbF_2$ charge as before, and an ingot is grown in a manner analogous to that described in Example 1 above, making power adjustments as required. The position of the probe at the interface did not remain essentially constant and sudden power requirements are necessary. After about 10 hr there is an indication that the growing crystal moved within the crucible, coming to rest on the bottom. The ingot is found to be a clear and optically integral single crystal.

EXAMPLE 3

The bottom of a stepped crucible of dense 9RL graphite having stepped walls of the general configuration illustrated in FIG. 3 is machined so as to cover the entire bottom with twin sets of triangular grooves shown in FIG. 6A, at right angles to one another as shown in FIG. 7. The crucible is charged with a $CaF_2$/$PbF_2$ charge as before, and an ingot is grown in a manner analogous to that described in Example 1 above, making power adjustments as required. The position of the probe at the interface remained essentially constant indicating that no sudden power requirements were necessary. At no time was there any indication that the growing crystal had moved within the crucible. The ingot is supported on the steps of the crucible and because the periphery of the ingot is not adhered to the walls, the ingot is lifted out of the crucible. The ingot is found to be a clear and optically integral single crystal.

Figure 10:
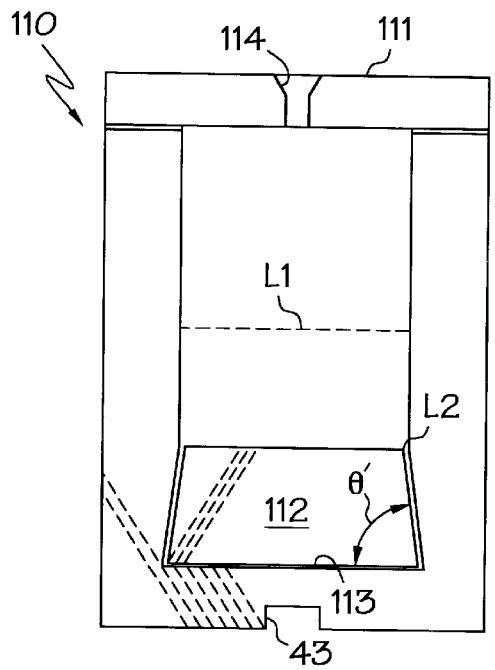
FIG. 10 is a side elevational half cross-sectional view schematically illustrating a monolithic graphite crucible having a bottom with a "reverse taper" and a grooved floor; and the crucible is covered with a graphite cover.

Referring to FIG. 10 there is shown a cross-section of a generally cylindrical monolithic flat-bottomed graphite crucible 110, with a central recess 43, the crucible having a graphite cover 111 which seals its top while an ingot 112 is grown from a charge of essentially pure crystals. The cover is provided with a probe hole 114. The crucible is preferably machined from a large cylinder of graphite, the height of the crucible being about four times the height of the ingot 112. Floor 113 of the crucible is grooved. The interior surfaces of the walls of the crucible are smooth, typically by coating the interior surfaces with a temperature resistant coating, or by providing a surface polished smooth with fine metal or glass wool, or 3M Scotchbrite® abrasive pads then with ashless paper to minimize the extent to which melt might enter pores of the graphite, and thus support the weight of the growing ingot. The surface of the mass of crystals charged, e.g. an alkaline earth metal fluoride such as $CaF_2$, is indicated at level L1, the planarity of the level being a function of the size of the crystals—the larger the crystals, the less level the surface.

Upon solidification of the molten charge, the cooled ingot has an upper surface designated level L2, this being about half the height L1 measured from the grooved floor 113 of the crucible. The cylindrical wall begins to be reverse tapered at L2, the periphery of the crucible's grooved floor 113 having a larger cross-section than that at L2 or above it. The tapered walls are also polished smooth so that the bottom surface of the growing ingot is always in contact with the grooved floor 113, and as shown, the cooled ingot's slightly frustoconical surface shrinks away from the sides of the crucible. The amount of linear shrinkage depends upon the particular salt being used to grow the ingot, that of $CaF_2$ being about 1%, and that for halides of alkali metals being about 2%.

In the drawing, the reverse taper is exaggerated to illustrate the requirement that the solidifying ingot 112 maintain contact with the grooved floor 113. In practice, the taper need only allow for enough shrinkage as will permit the bottom of the cooled ingot to be withdrawn through the upper cylindrical body of the crucible. For example, to grow a $CaF_2$ ingot about 30 cm in diameter and 30 cm high (L2), 80 mesh (U.S. Standard Sieve) crystals are charged to a crucible 30 cm in diameter and 120 cm high, to a height of about 60 cm (L1). The floor of the crucible is about 30.3 cm in diam and the reverse tapered walls rise to a height of 30 cm from the floor, where at L2, the diameter of the crucible is 30 cm. Thus it is seen that the included angle θ' (theta prime) the side of the ingot forms with the floor 113 of the crucible is less than 90° but greater than about 85°, the precise minimum angle required depending upon the shrinkage of the melt.

Figure 11:
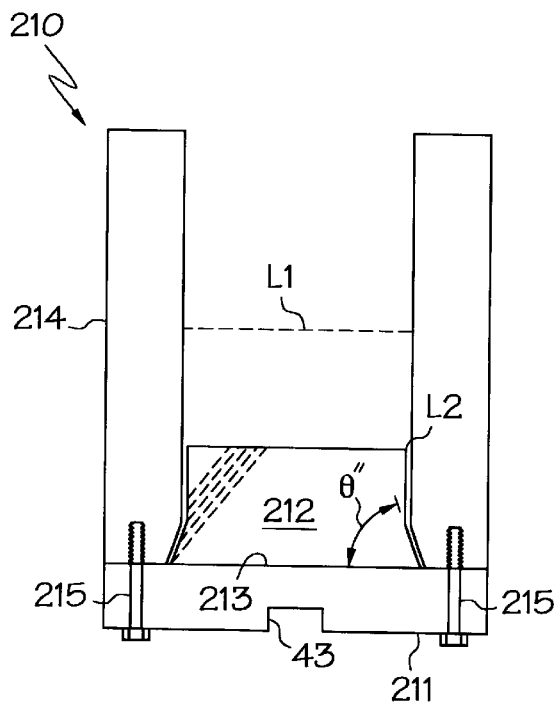
FIG. 11 is a side elevational half cross-sectional view of a graphite crucible having a disassemblable bottom with a "reverse taper", and a grooved flat floor on which an ingot rests.

In view of the likely difficulty of removing an ingot from the crucible with such close clearance as will be provided by shrinkage of the melt in the crucible shown in FIG. 10, it is preferred to have a cylindrical crucible 210, illustrated in cross-section in FIG. 11 without its cover, in which the interior surfaces are smooth except for the crucible's bottom 211 which has a grooved floor 213, and the bottom is removably secured to the bottom of cylindrical wall 214 with graphite lag bolts 215. This construction renders the extent of a reverse taper near the bottom of the crucible immaterial. Nor is it material where the taper is commenced so long as continuous contact of the growing ingot with the grooved floor 213 of the crucible is maintained. Thus, to grow a $CaF_2$ ingot 212 from a similar charge of crystals as is used in FIG. 10, which charge presents a level L1 in crucible 210, for ease in withdrawing the ingot 212, the taper may be arbitrarily larger than that required for the crucible 110 in FIG. 10. The included angle $\mu$ (theta double-prime) the side of the ingot forms with the floor 213 of the crucible may be substantially smaller than 85° and a substantial portion of the ingot below its upper surface L2 may be cylindrical.

It will now be evident that if the cylindrical graphite crucible was to have no reverse taper the right cylindrical ingot formed from a shrinking melt would be removable provided the shrinkage is sufficient to afford the necessary clearance. As long as contact of the ingot with the grooved floor is maintained, the ingot grown not only contains fewer multiplicities than if grown in a crucible with a smooth floor, but the ingot is also substantially free from sparkles.

Figure 12:
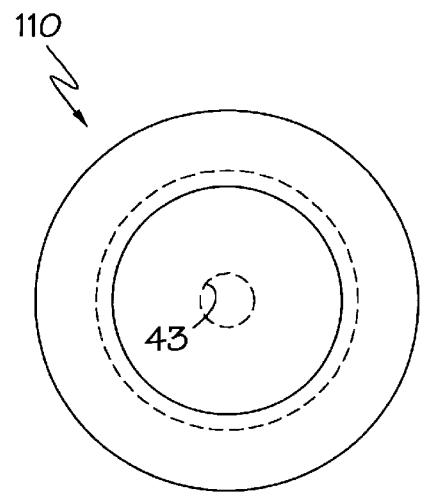
FIG. 12 is a top plan view of the disassemblable graphite crucible having a bottom with a "reverse taper", and a grooved floor without the ingot in it.

FIG. 12 schematically illustrates a top plan view of crucible 11 (without its cover) showing grooves 92, 93 crisscrossing the floor 113, as shown in FIG. 9.

Figure 13:
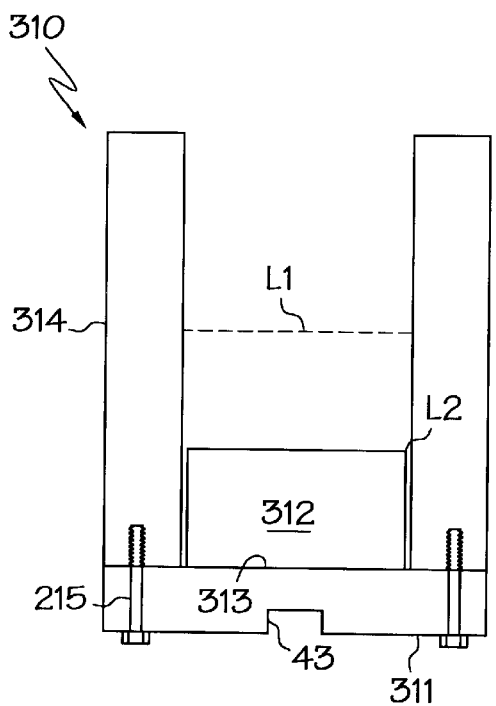
FIG. 13 is a side elevational half cross-sectional view of a disassemblable graphite crucible having a smooth cylindrical interior and a grooved flat floor on which an ingot rests.

Illustrated in FIG. 13 is a cylindrical graphite crucible 310 (without its cover) in which an ingot 312 is grown from a similar charge of $CaF_2$ crystals as used before, so that the charge presents a level L1 before the charge is melted. The crucible's bottom 311, having a grooved floor 313, is preferably removably secured to the cylindrical walls 314 with lag bolts 215. The cooled ingot is shown shrunk away from the walls but if crystals formed on the cover (because of sublimation) are dislodged and drop into the annular space around the ingot, it will not be easily removed. However, with the bottom 311 unbolted, the cooled ingot may be pushed out from either the top or the bottom, or both, of the crucible, depending when, and if, the ingot gets bound.

In each of the crucibles shown above, the bottom is shown as having a flat grooved floor. It will be evident that since the function of the grooves is to prejudice the initial growth of the ingot, as the firstt submicron thickness of crystal is formed, along directions favored by the orientation of the crystal lattice being grown, it is not essential that the floor of the crucible be flat. Though typically a flat grooved floor is preferred, an undulating grooved floor may be used if a particular salt favors formation of an essentially single crystal lattice when initial growth occurs in vertically slightly spaced-apart planes, spaced apart in the range from about 50 μm to about 5 mm.

Figure 14:
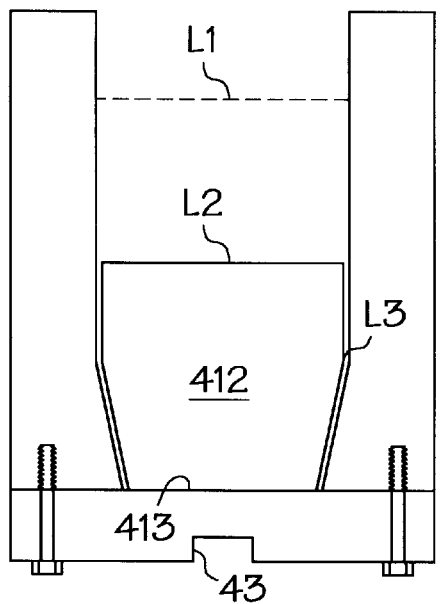
FIG. 14 is a side elevational half cross-sectional view of a disassemblable graphite crucible having a smooth cylindrical interior terminating in walls tapered downwards at an angle such as will, upon cooling of an ingot with sufficient shrinkage, will permit substantially continuous contact of the ingot with the crucible's grooved floor.

Referring to FIG. 14 there is shown a cross-section of a crucible 410 having a cylindrical body terminating in a slightly downwardly tapered lower portion terminating in a grooved floor 413. As before, the crucible is charged with an equivalent mass of crystals of $CaF_2$ which provide an initial level L1 before formation of an ingot 412 which has its upper surface at level L2. At level L3 a shoulder is formed where the walls of the crucible are tapered downwards only enough so that upon shrinkage of the melt upon cooling, the ingot is not supported at the shoulder but remains in contact with the floor 413. The obtuse angle α' (alpha prime) formed by the side of the ingot is greater than 90° but less than about 95° depending upon the shrinkage of the melt. Even if the ingot is supported at L3 the time during which it is so supported is insufficient to provide a disruptive gap between the bottom of the ingot and the grooved floor. By "disruptive gap" is meant a gap sufficient to cause an uncontrollable change in control of the temperature gradient. The precise maximum angle permitted will allow the cooled ingot to be pushed out in only one direction, from the top of the crucible, after the bottom 411 is removed. The ingot 412, if not an essentially single crystal, will be found to contain a minimal number of multiplicities, and because the ingot remained in contact with the grooved floor, the ingot will also be substantially free of sparkles.

Figure 15:
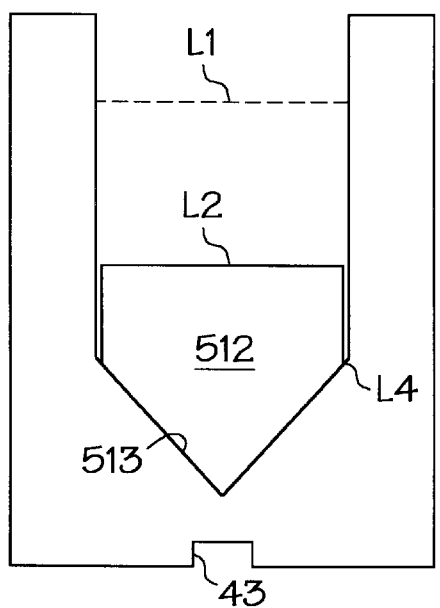
FIG. 15 is a side elevational half cross-sectional view of a conventional graphite crucible having a smooth cylindrical interior terminating in a right circular cone, the downward taper being such as will, upon cooling of an ingot, cause it to be supported at the base of the inverted cone so that the bottom surface of the ingot is spaced apart from the crucible's grooved floor.

Referring to FIG. 15 there is illustrated a cross-section of a crucible 510 having a cylindrical body terminating in a right cylindrical bottom having a grooved floor 513. As before, the crucible is charged with an equivalent mass of crystals of $CaF_2$ which provide an initial level L1 before formation of an ingot 512 which has its upper surface at level L2. At level L4 a shoulder is formed where the walls of the crucible are tapered downwards enough so that upon shrinkage of the melt upon cooling, the ingot is supported at the shoulder and breaks contact with the floor 413. The obtuse angle α (alpha double-prime) formed by the side of the ingot is greater than about 95° so that the ingot is supported at L4 and forms a disruptive gap between the bottom of the ingot and the grooved floor. The ingot upon cooling, is conventionally removed through the top of the crucible. The ingot 512, if not an essentially single crystal, will be found to contain a minimal number of multiplicities, but because the ingot broke contact with the grooved floor, the ingot will contain substantially more sparkles than the ingot 412.

I claim:

1. A macrocrystal having an effective diameter of at least 15 cm, grown in earth's gravity in a graphite or carbon crucible containing an alkali metal halide or alkaline earth metal halide melt in a Stockbarger furnace said melt having a surface tension high enough so as to fail to substantially wet the walls of said crucible;

said macrocrystal having an upper portion above and a lower portion below the mid-horizontal plane through said macrocrystal, said upper portion terminating in a heel demarcatable from said upper portion, said lower portion having at least two indentations which are transversely spaced apart, and said upper portion is essentially free from gas-induced sparkles.

2. A macrocrystal produced by growing it from a shrinking melt which fails substantially to wet a crucible's interior surface, said crucible being formed from a heat resistant and thermally conductive material which is substantially impermeable to said melt, said macrocrystal having an effective diameter greater than 7.5 cm and an upper portion above and a lower portion below the mid-horizontal plane through said macrocrystal, said lower portion having at least two transversely spaced apart protuberances adapted to support said macrocrystal near its edges while the macrocrystal is being formed, and to maintain said macrocrystal's bottom in spaced apart relationship with said crucible's bottom.

3. A macrocrystal produced by growing it from a shrinking melt which fails substantially to wet a crucible's interior surface, said crucible being formed from a heat resistant and thermally conductive material which is substantially impermeable to said melt, said macrocrystal having a diameter greater than 7.5 cm, said macrocrystal's exterior surface, except for the bottom surface, being substantially smooth and free of indentations, and, said bottom surface having at least one ridge therein, said ridge having a height sufficient to initiate and control growth of a crystal lattice in a substantially planar direction.

4. The macrocrystal of claim 3 wherein said bottom has a reverse taper and having plural ridges therein and grooves therebetween.

5. The macrocrystal of claim 4 wherein the grooves run parallel to each other in only one direction.

6. The macrocrystal of claim 4 wherein the grooves run parallel to each other in plural directions at an angle, one parallel set being at an angle to another parallel set, the angle corresponding to the desired direction of crystal growth propagation.

7. The macrocrystal of claim 6 wherein the angle is chosen from 60°, 72° or 90°.

* * * * *